(12) United States Patent
Wicker et al.

(10) Patent No.: US 8,344,348 B2
(45) Date of Patent: Jan. 1, 2013

(54) MEMORY DEVICE

(75) Inventors: Guy Wicker, Southfield, MI (US); Wolodymyr Czubatyj, Warren, MI (US)

(73) Assignee: Ovonyx, Inc., Sterling Heights, MI (US)

( * ) Notice: Subject to any disclaimer, the term of this patent is extended or adjusted under 35 U.S.C. 154(b) by 11 days.

(21) Appl. No.: 12/244,421

(22) Filed: Oct. 2, 2008

(65) Prior Publication Data

US 2010/0084625 A1   Apr. 8, 2010

(51) Int. Cl.
 *H01L 47/00* (2006.01)
(52) U.S. Cl. .................................. 257/4; 257/2; 257/3
(58) Field of Classification Search .............. 257/2–5
 See application file for complete search history.

(56) References Cited

U.S. PATENT DOCUMENTS

| | | | |
|---|---|---|---|
| 5,536,947 A * | 7/1996 | Klersy et al. ................. | 257/3 |
| 6,329,666 B1 * | 12/2001 | Doan et al. .................. | 257/3 |
| 7,504,653 B2 * | 3/2009 | Lung ............................ | 257/2 |

\* cited by examiner

*Primary Examiner* — Ori Nadav
(74) *Attorney, Agent, or Firm* — Honigman Miller Schwartz and Cohn LLP

(57) ABSTRACT

An electrical device includes a first electrode and a second electrode. A first active material is between the first electrode and second electrode. A second active material is between the first electrode and second electrode. A nonlinear electrode material is disposed between the first electrode and the second electrode. The nonlinear electrode material is electrically in series with the first electrode, the first active material, the second active material, and the second electrode. The first electrode and the first active material undergo no chemical or electrochemical reaction when current passes between the first electrode and the second electrode.

30 Claims, 9 Drawing Sheets

MEMORY DEVICE

TECHNICAL FIELD

The embodiments described herein are generally directed to memory devices including a phase-change material.

BACKGROUND

Non-volatile memory devices are used in certain applications where data must be retained when power is disconnected. Applications include general memory cards, consumer electronics (e.g., digital camera memory), automotive (e.g., electronic odometers), and industrial applications (e.g., electronic valve parameter storage). The non-volatile memories may use phase-change memory materials, e.g., materials that can be switched between a generally amorphous and a generally crystalline state, for electronic memory applications. The memory of such devices typically comprises an array of memory elements, each element defining a discrete memory location and having a volume of phase-change memory material associated with it. The structure of each memory element typically comprises a phase-change material, one or more electrodes, an isolation or access device, and one or more insulators.

One type of memory element originally developed by Energy Conversion Devices, Inc. utilizes a phase-change material that can be, in one application, switched between a structural state of generally amorphous and a structural state of generally crystalline local order or between detectable structural states of differing local order across the entire spectrum between completely amorphous and completely crystalline states. These different structural states have different values of resistivity and therefore, each state can be determined or distinguished by electrical sensing. Typical materials suitable for such applications include those utilizing various chalcogenide materials. Unlike certain known devices, these electrical memory devices typically do not use field-effect transistor devices as the memory storage element. Rather, they comprise in the electrical context, a monolithic body of thin film chalcogenide material. As a result, very little area is required to store a bit of information, thereby providing for inherently high-density memory chips.

The phase-change materials are also non-volatile in that, when set in either a crystalline, semi-crystalline, amorphous, or semi-amorphous state representing a resistance value, that value is retained until reprogrammed, as that value represents a physical state of the material (e.g., crystalline, amorphous, or partially crystalline/partially amorphous). Furthermore, reprogramming requires little energy to be provided and dissipated in the device. Thus, phase-change memory materials represent a significant improvement in non-volatile memory technology.

In an array of phase-change memory devices, it is necessary to be able to read and write individual devices without disturbing neighboring devices. In most practical arrays, the memory devices are interconnected between word lines and bit lines. The word lines and bit lines permit addressing of the memory devices. Each word line is connected to several memory devices (e.g. multiple devices in a row of an array). Each bit line is also connected to several memory devices (e.g. devices in a column of an array). Each memory device, however, is interconnected between a single word line and a single bit line, where the word line-bit line combination is unique for each memory device. This configuration permits each memory device to be individually addressed or selected for reading and writing.

To read and write, a memory device is selected by applying a voltage between the word line and bit line to which the device is interconnected. Since each word line is connected to other memory devices in the row of the selected device and since each bit line is connected to other memory devices in the column of the selected device, read and write voltages applied to the word line and bit line of the selected memory device create ancillary voltage changes that may influence the structural state of non-selected devices. To prevent ancillary voltages from disturbing the structural state of non-selected devices, it is common to include an isolation device with each memory device in an array. The isolation device is normally interconnected between the word line and bit line that address the memory device and in series with the memory device. The purpose of the isolation device is to electrically isolate the memory device from residual voltages that exist within an array. When a memory device is not selected, the isolation device is in a high resistance OFF state that prevents leakage of current from the array to the non-selected memory device. When the memory device is selected, the voltage applied between the word line and bit line of the device is sufficient to transform the isolation device to a low resistance ON state that permits the currents needed for reading and writing to access the memory device.

The Ovonic Threshold Switch ("OTS") is a promising isolation device. The OTS has an OFF state that is highly resistive and highly effective at preventing leakage currents from influencing non-selected devices in an array. In its ON state, the OTS is highly conductive and readily permits electrical interrogation of a memory device. The ON state of the OTS is produced when the voltage across the OTS exceeds a threshold value and is readily established by providing at least a threshold level voltage between the word line and bit line of a selected cell.

A drawback associated with the OTS, however, is that the transition from the OFF state to the ON state is accompanied by a snapback in voltage. When the threshold voltage is reached, the OTS voltage abruptly decreases and the current through the OTS abruptly increases. The snapback nature of OTS operation leads to variability in its operating characteristics that detract from practical performance. Variability can occur from cycle-to-cycle in the operation of a given OTS or as an inconsistency in operating parameters across different devices in an array. Variability in threshold voltage, for example, complicates the operation of a memory device because a given select voltage may switch the OTS to its ON state in one cycle and not in another cycle. Similarly, a particular threshold voltage may switch some OTS devices in an array and not others.

In addition to effective isolation of phase-change memory devices in an array, it is also desirable to operate the phase-change memory devices in an array with minimum power. The competitiveness of phase-change technology depends in part on achieving memory devices and arrays that can be programmed with low currents. To effect a transition of a phase-change material from one structural state to another, it is necessary to apply sufficient energy to heat the material. For electrical devices, the thermal energy is a consequence of Joule heating localized near the phase-change material that is produced by the programming current. To increase the local temperature for a given programming current, it is necessary to increase the resistance of the electrode or other circuit element adjacent to the phase-change material. It is further desirable to avoid interdiffusion of elements between the phase-change material and the locally heated electrode or circuit element adjacent to it. Common electrode materials such as TiN or TiAlN provide good protection against elemental interdiffusion, but are insufficiently resistive to permit programming at preferred current levels.

A need exists for a phase-change memory array that offers the low leakage currents of an OTS without the inconsistency of performance associated with OTS operation. The memory array should further offer low programming currents and a device configuration that prevents interdiffusion of elements between adjacent layers or devices.

SUMMARY

An electrical device includes a first electrode and a second electrode. A first active material is between the first electrode and second electrode. A second active material is between the first electrode and second electrode. A nonlinear electrode material is disposed between the first electrode and the second electrode. The nonlinear electrode material is electrically in series with the first electrode, the first active material, the second active material, and the second electrode. The first electrode and the first active material undergo no chemical or electrochemical reaction when current passes between the first electrode and the second electrode.

Another electrical device may include a first electrode and a nonlinear resistive layer deposited over the first electrode. Also included is an insulator deposited over the resistive layer. The insulator includes a hole therethrough. A first active layer is deposited over the nonlinear electrode. A second active layer is deposited over the first active layer. A second electrode is deposited over said second active layer. The first and second electrodes are in electrical communication with the first and second active layers and the first electrode is in electrical communication with the first and second active layers through the nonlinear resistive layer.

Also described is a method for making a switching device. The method includes providing a substrate, forming a first conductive material over the substrate, forming a nonlinear resistive material over the first conductive material, forming a first active material over the nonlinear resistive material, forming a second active material over the first active material, and forming a second conductive material over the second active material.

BRIEF DESCRIPTION OF THE DRAWINGS

The features and inventive aspects will become more apparent upon reading the following detailed description, claims, and drawings, of which the following is a brief description:

DETAILED DESCRIPTION

Figure 1:
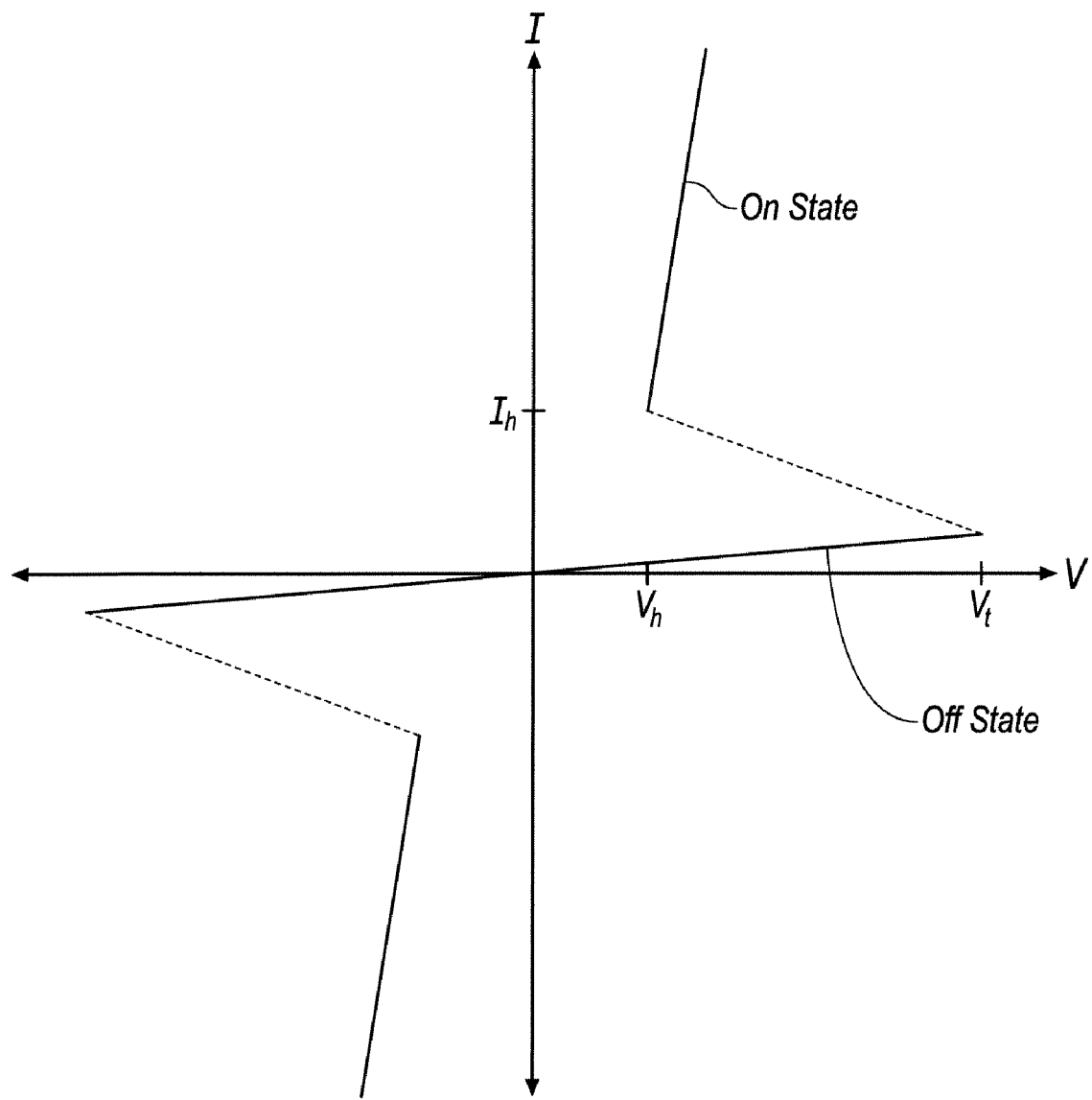
FIG. 1 is a schematic depiction of the I-V characteristics of an Ovonic Threshold Switch (OTS) material.

Referring now to the drawings, illustrative embodiments are shown in detail. Although the drawings represent the embodiments, the drawings are not necessarily to scale and certain features may be exaggerated to better illustrate and explain novel aspects of an embodiment. Further, the embodiments described herein are not intended to be exhaustive or otherwise limit or restrict the claims to the precise form and configuration shown in the drawings and disclosed in the following detailed description.

Embodiments of an electronic device, which may include memory devices and/or switching devices, are discussed herein. The electronic device is discussed herein in the context of a memory device. However, one skilled in the art recognizes that the electronic device may be employed as a memory device and/or a switching device. Thus, the memory device and switching device are interchangeable. The electronic device includes a first active material that may be configured as a programmable resistance material, phase-change material, chalcogenide material, switching material or isolation device. As used herein, "active material" refers to an electrically stimulable material that alters structure, physical state, or conductivity in response to an applied electric field. The instant device also includes a nonlinear resistive layer and a second active material. The first active material, second active material, and nonlinear resistive layer may be provided in series with a first electrode and a second electrode. The device may be addressed using the first and second electrodes, which are in electrical communication with the phase-change layer switching layer or other active layer. In an embodiment, the second active material may be configured as an Ovonic Threshold Switch (OTS) material. Additionally, the nonlinear resistive layer may be configured as a carbon-nitride or carbon-nitrogen material (CN) material. The nonlinear resistive layer may also be referred to herein as a nonlinear electrode material.

The embodiments described herein describe how a phase-change memory device may include a high series resistance to achieve low current operation and improved isolation from adjacent memory devices in an array. An example of the memory device includes a carbon-nitride nonlinear resistive material, an Ovonic Threshold Switch (OTS) material and an Ovonic Unified Memory (OUM) device that are in series. In brief, the resistive properties of the carbon-nitride material reduce the current needed to program the OUM device. In addition, the nonlinear behavior of the carbon-nitride material at high fields allows for a "wingless" isolation capability that improves device reliability (explained below in detail with respect to FIG. 2B). At low fields, the high resistance of the OTS material reduces leakage. Moreover, the threshold voltage of the OTS material may be chosen to be relatively close to the turn-on voltage (e.g., critical voltage) of the carbon-nitride material.

A high resistance electrode or resistive material adjacent to a phase-change material facilitates operation at low current. During operation, the current density through the electrodes may be as high as 1.0E7 A/cm$^2$ (1 times ten to the seventh Amps per square centimeter) to provide sufficient Joule heating to induce a structural transformation in the phase-change material. In many phase-change materials, local temperatures over 600° C. (six hundred degrees Celsius) are needed to perform a reset operation. To achieve stable operation over many cycles, the resistance of the electrodes should be stable at such high current densities and the associated high operating temperature of the device. As shown and described in the examples herein, a carbon material may be reactively sputtered in a nitrogen atmosphere to obtain a carbon-nitride electrode for phase-change electrical devices that exhibits stable and high resistivity under relatively high current densities and relatively high local operating temperatures. In general, a nonlinear electrode or resistive layer may be made by sputtering carbon in nitrogen atmosphere. The resulting electrode or resistive layer may have a resistivity of about 100 milliohms to about 5 ohms.

Additionally, an OTS device placed in series with an OUM or other active layer device acts as an isolation element to protect the OUM or other active layer device from electrical signals that are generated within an array when other memory or active layer devices are selected. OTS devices have high "off" state resistivity and remain highly resistive at applied voltages below a threshold voltage. When the applied voltage reaches the threshold voltage, an OTS device switches to a low resistance "on" state and the voltage across it rapidly drops. Due to factors such as material imperfections, processing non-uniformities, and inconsistencies in operation, the threshold voltage for the OTS associated with a particular memory or active layer device may vary over time or with cycling and that variance may lead to erratic behavior of the memory or active layer device. In an array, an OTS isolation device is associated with each memory or active layer device and variability in the threshold voltage may occur across the different OTS devices in the array.

One factor believed to contribute to variability in the properties of OTS devices is the switchback in current and voltage that accompanies the transformation of the OTS from its high resistance "off" state to its low resistance "on" state. FIG. 1 is a schematic depiction of the current-voltage (I-V) characteristics of an OTS device. The I-V curves for the "off" state and "on" state are shown in FIG. 1. The switching transformation from the "off" state to the "on" state is depicted by the dotted line and occurs when the voltage applied across the OTS in its "off" state reaches the threshold voltage ($V_t$). The switching transformation is accompanied by an abrupt increase in current and an abrupt decrease in voltage. The snapback from the high resistance "off" state to the low resistance "on" state is euphemistically referred to as "winged" operation due to the general appearance of the "off" state branch and dotted transitional line in the I-V diagram.

The nearly discontinuous nature of the switching transformation may create stresses, defects or other disturbances of the OTS material that may contribute to variability in the operating parameters of the OTS. The discontinuous nature of the switching transformation may also impact the operational characteristics of a memory or active layer device connected in series with an OTS. When the voltage or current of an OTS device change discontinuously, the elements in series with the OTS experience a discontinuous change in voltage or current as well and these changes may deleteriously influence the performance of the elements. Phase-change materials, for example, are susceptible to effects such as electromigration or electrochemical reaction that may be induced or augmented by discontinuities in current or voltage.

Accordingly, it is desirable to have an isolation device or device structure that provides the high resistivity of the "off" state of the OTS device along with a transition to a conductive "on" state that lacks the discontinuous snapback in voltage and current associated with the OTS. It is further preferable that the transition to the conductive "on" state occur at constant or nearly constant voltage so that the dramatic increase in current that accompanies the transition occurs without significantly disturbing the elements in series with the isolation device. Such devices may be referred to herein "wingless" devices. At the current densities needed to isolate a phase-change memory array (e.g., an OUM array), OTS devices alone may not exhibit "wingless" behavior.

As demonstrated hereinbelow, wingless operation may be achieved with a nonlinear electrode or resistive layer. In one embodiment, a carbon-nitride material functions as a nonlinear electrode when placed in series with an OUM material and enables "wingless" operation. The instant inventors have found, however, that nonlinear resistive materials alone are generally insufficiently resistive at low fields to serve as effective isolation elements. The low field resistivity of nonlinear resistive materials is significantly lower than the low field ("off" state) resistivity of an OTS device and as a result, nonlinear resistive materials experience much higher leakage currents than OTS devices. In one embodiment of the instant invention, a wingless memory device is formed by placing a nonlinear electrode and an OTS material in series with a programmable resistance material (e.g. OUM or phase-change material) or other active material layer.

A phase-change or OUM memory device may be written to and read in a manner described in U.S. Pat. No. 6,687,153, issued Feb. 3, 2004, to Lowrey, for "Programming a Phase-Change Material Memory", which is hereby incorporated by reference in its entirety, as well as other methods known to those skilled in the art. The memory device may also be configured as an array of devices such that a high-density memory array is created. The switching device may have the operational characteristics of an Ovonic Threshold Switching device, such as the ones described in U.S. Pat. Nos. 5,543,737; 5,694,146; 5,757,446; and 6,967,344; the disclosures of which are hereby incorporated by reference in their entirety. The switching material is generally a material having a resistive state and a conductive state, where a transformation between the resistive state and conductive state may be induced upon application of an electric field, electric current or voltage across the material as shown, for example, in FIG. 1. In a preferred embodiment, the switching material is reversibly transformable between the resistive and conductive states.

In yet another aspect, the memory device may be configured to provide multi-level storage. That is to say, the memory device may have a plurality of discrete and identifiable states which allow for multi-bit storage in a single memory element, rather than a common binary storage element. In one embodiment, the active material of a multi-level storage device is a phase-change memory material operable between three or more structural states distinguishable on the basis of electrical resistance.

As discussed herein, the term "electrical communication" is intended to mean that two or more structures allow electrical current to flow from one structure to another. In one example, electrical communication may arise from direct contact of one material to another. In another example, electrical communication may include an intermediate structure such as a resistive layer, a semiconductive layer, a carbon layer, a phase-change material, and/or a metal structure that facilitates or enables electrical current flow between structures. Such a structure, in the example of a carbon layer, may be desirable when the carbon layer is used as an etch-stop in a fabrication process or to modify the resistivity of a contact. Alternatively, the structure may also reduce metal migration between two dissimilar materials while still allowing electrical current to flow. Thus, the term electrical communication is not limited merely to two physically contacting structures.

Figure 2A:
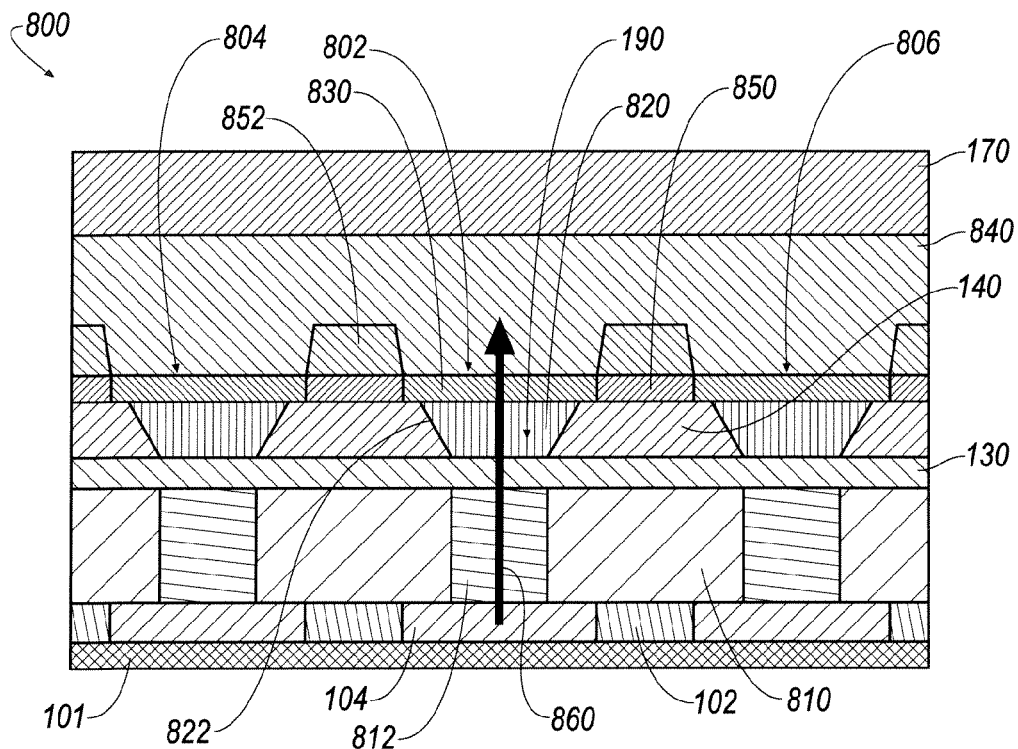
FIG. 2A is a cross-sectional view of an example of a phase-change memory device including a nonlinear electrode in series with an Ovonic Unified Memory (OUM) material and an Ovonic Threshold Switch (OTS) material.

Referring now to FIG. 2A, a cross-sectional view is shown of an embodiment of an active material device array 800 that includes phase-change memory devices 802, 804, 806. Each phase-change memory element (e.g., element 802) includes a nonlinear electrode layer 130 in series with an Ovonic Unified Memory (OUM) material 820 as a first active material and an Ovonic Threshold Switch (OTS) material 830 as a second active material. Phase-change memory device 802 may be considered a stacked device wherein structures are assembled in layers. When reading or writing memory device 802, a current 860 travels from a first interconnect 104 through first electrode 812, nonlinear electrode layer 130, OUM material 820, and OTS material 830 to second electrode 840. Of note, is that the sequence of the layers that are in series (e.g., the in-series positioning) may be altered and still achieve the desired device behavior. As shown in the example of FIG. 2A, nonlinear electrode layer 130 is shown in intimate contact with OUM material 820.

OUM material 820 and OTS material 830 may be considered active materials. OUM material 820 may be generally classified as a programmable resistance material that includes a phase-change material, where chalcogenide alloys capable of transforming between amorphous, crystalline, and partially crystalline structural states are representative embodiments. OTS material 830 is transformable from a resistive state to a conductive state and has I-V characteristics similar to those depicted in FIG. 1. OTS material 830 is a predominantly amorphous phase material that exhibits little tendency to crystallize at the operating conditions of array 800 and does not rely on a structural phase transition to switch between a resistive state and a conductive state.

In the embodiment of FIG. 2A, nonlinear electrode 130, OUM material 820, and OTS material 830 are connected in a particular order in series between first electrode 812 and second electrode 840. In other embodiments, the order of series interconnection of nonlinear electrode 130, OUM material 820, and OTS material 830 may differ. Illustrative series interconnections include: first electrode 812—OTS material 830—nonlinear electrode 130—OUM material 820—second electrode 840; first electrode 812—OTS material 830—OUM material 820—nonlinear electrode 130—second electrode 840; first electrode 812—nonlinear electrode 130—OTS material 830—OUM material 820—second electrode 840; first electrode 812—OUM material 820—nonlinear electrode 130—OTS material 830—second electrode 840; and first electrode 812—OUM material 820—OTS material 830—nonlinear electrode 130—second electrode 840.

A lower isolation layer 101 carries phase-change memory array 800. Lower isolation layer 101 is generally a dielectric and may be, for example, a layer of silicon dioxide ($SiO_2$) (present as a grown oxide on an underlying silicon-based substrate or $SiO_2$ formed from TEOS (tetraethoxysilane)), other oxides, silicon nitride ($Si_3N_4$ or $SiN_x$), or other nitrides. Lower isolation layer 101 is typically supported by an underlying substrate or wafer that may include peripheral circuitry such as transistors, diodes, power supplies etc. Because phase-change memory array 800 is typically constructed between various layers of an integrated circuit, insulative structures are provided for isolation. Electrical isolation is provided for the efficient operation of phase-change memory array 800 so that electric current leakage is reduced and undesired interactions with adjacent circuitry or neighboring composite chalcogenide devices are minimized or avoided.

First interconnect 104 and second electrode 840 may be made of metal, metal alloys, or conductive metal compounds that may be further connected to external circuits. Typically, first interconnect 104 and/or second electrode 840 may be connected to memory read/write circuitry when phase-change memory array 800 is configured as a memory device.

First electrode 812 and second electrode 840 may be made of a metal, metal alloy, or conductive metal compound, including but not limited to tantalum nitride, titanium nitride, titanium silicon nitride, tungsten, titanium tungsten, tungsten silicide, molybdenum, molybdenum nitride, other metal nitride, other metal aluminum nitride, other metal silicon nitride, or other sufficiently conductive material. As indicated hereinabove, electrical operation of a phase-change material entails generation of heat by Joule heating in the local vicinity of the phase-change material. A more resistive electrode material facilitates Joule heating and permits operation of a phase-change material at lower current levels. When first electrode 812 is configured as a heater, the material may be selected to generate resistive heating when a current passes therethrough. In general, first electrode 812 is formed underneath nonlinear electrode layer 130, which in this example is below OUM material 820. In an embodiment, first electrode 812 may include a tantalum nitride alloy that may be deposited, for example, by sputtering. Second electrode 840 may be, for example, copper or a copper alloy. Sputtering or other methods may be used to deposit second electrode 840 over OTS material 830.

Nonlinear electrode layer 130 is deposited in a layer and does not necessarily require etching or material removal. Because the resistance of nonlinear electrode layer 130 is relatively high, current leakage from one device to another (e.g., leakage from memory element 802 to memory devices 804, 806) is not significant. One benefit to maintaining nonlinear electrode layer 130 intact may include a reduction in processing steps required to manufacture phase-change memory device 802. However, if desired, nonlinear electrode layer 130 may be etched or segmented to further reduce current leakage between adjacent memory devices 802, 804, 806.

OUM material 820 is provided as a layer of memory or switching material, such as a chalcogenide, and is in electrical communication with first electrode 812 and second electrode 840. OUM material 820 may be a Ge—Sb—Te ternary alloy such as a $Ge_2Sb_2Te_5$ chalcogenide alloy (hereinafter referred to as GST225). As used herein, the term phase-change memory material refers to a material capable of changing between two or more phases that have distinct electrical characteristics. OUM material 820 preferably includes at least one chalcogen element selected from Te and Se, and may further include one element selected from the group consisting of Ge, Sb, Bi, Pb, Sn, As, S, Si, P, O, N, In and mixtures thereof. Suitable phase-change materials include, but are not limited to, GaSb, InSb, InSe, $Sb_2Te_3$, GeTe, $Ge_2Sb_2Te_5$, ternary Ge—Sb—Te compositions, InSbTe, ternary In—Sb—Te compositions, ternary GaSeTe compositions, GaSeTe, $SnSb_2Te_4$, InSbGe, ternary In—Sb—Ge compositions, AgInSbTe, quaternary Ag—In—Sb—Te compositions, (GeSn)SbTe, quaternary Ge—Sn—Sb—Te compositions, GeSb(SeTe), quaternary Ge—Sb—Se—Te compositions, and $Te_{81}Ge_{15}Sb_2S_2$ and quaternary Te—Ge—Sb—S compositions. In switching device embodiments of the instant invention, the switching material may be selected from those compositions among the foregoing that demonstrate little or no tendency to undergo a structural or phase transformation under the conditions of device operation. The switching materials are preferably chalcogenide or pnictide materials that are amorphous and remain amorphous under the current and voltage conditions used to induce the switching transformation. Representative OTS materials include $As_2Te_3$, $As_2Se_3$, TAG ($As_{30}Te_{45}Ge_{25}$) and related ternary Te—As—Ge compositions, SAG ($As_{28}Se_{42}Ge_{30}$) and related ternary As—Se—Ge compositions, SLAGS ($As_{30}S_{12}Se_{33}Ge_{25}$) and related quaternary As—S—Se—Ge compositions, and $As_{35}Te_{40}Ge_{6.75}Si_{18}In_{0.25}$.

The resistivity of chalcogenides generally varies by two or more orders of magnitude when the chalcogenide material changes phase from an amorphous state (more resistive) to a polycrystalline state (less resistive). Electrodes 812, 840, deliver an electric current to the phase-change memory material. As the electric current passes from first electrode 812 to second electrode 840 through OUM material 820, at least a portion of the electric energy of the electron flow is transferred to OUM material 820 as heat. That is, the electrical energy is converted to heat energy via Joule heating. Joule heating may occur within OUM material 820 or within surrounding active, electrode or resistive layers in series with OUM material 820. The amount of electrical energy converted to heat energy increases with the resistivity of the electrical contact (and memory material) as well as with the current density (i.e., current divided by area), passing through the electrical contact and the memory material.

Examples of chalcogenide materials are found in commonly assigned U.S. Pat. Nos. 5,166,758, 5,296,716, 5,534,711, 5,536,947, 5,543,737, 5,596,522, 5,687,112, 5,694,146, 5,757,446, and 6,967,344. The disclosures of U.S. Pat. Nos. 5,166,758, 5,296,716, 5,534,711, 5,536,947, 5,543,737, 5,596,522, 5,687,112, 5,694,146, 5,757,446, and 6,967,344 are incorporated by reference herein.

OTS material 830 may be made of a class of fast switching materials that may include one or more chalcogen elements. Unlike phase-change memory materials, the compositions of OTS materials are such that no change in structural state occurs within the range of normal operation of the material. Instead, the OTS material retains an overall predominantly amorphous structure during operation. Application of a suitable energy signal, typically an electrical energy signal having a voltage above a critical threshold level, induces a change of the electrical characteristics of the OTS device from a relatively resistive ("off") state to a relatively conductive ("on") state. The relatively conductive state persists for so long as the current passing through the OTS material remains above a critical holding level (depicted as "$I_h$" in FIG. 1). Once the energy signal is removed or the current otherwise decreases below the level needed to sustain the relatively conductive state, the OTS material relaxes back to its relatively resistive state.

Under one theory of operation, an OTS material achieves its conductive on state through the formation of a localized, conductive filamentary region that extends across the material between opposing electrical contacts when the voltage applied between the contacts is at or above a threshold voltage. When the current across the material is decreased to below the holding level needed to sustain the conductive state, the filamentary region collapses and the material switches back to its resistive off state. As the material is switched between its resistive and conductive states over multiple cycles of operation, the filamentary region is repeatedly formed and extinguished. Basic principles and operational features of the OTS are presented, for example, in commonly assigned U.S. Pat. Nos. 3,271,591; 5,543,737; 5,694,146; and 5,757,446, the disclosures of which are incorporated by reference herein.

A consequence of this mechanism of operation is that the reproducibility and stability of the switching event over multiple cycles of operation depends on the consistency of the characteristics of the localized filament. Optimal performance is enhanced by consistent physical placement of the filament within the OTS material and a reproducible threshold voltage to insure control over initiation of the switching event. It is also necessary for the holding current to remain stable over multiple cycles of operation. In practice, it has been observed that the threshold voltage, holding current, and/or physical placement of the filamentary region of OTS materials may vary upon cycling. If the variance of these parameters is too great, the switching characteristics of OTS materials may be compromised.

In the operation of memory device 802, first electrode 812 and second electrode 840 are connected to support circuitry (not shown) for programming (e.g., writing information) and reading memory device 802. The support circuitry may include the capability to program and read memory device 802 in binary mode, which provides two states, as well as a multi-level mode, which provides a variable number of states.

When combined with support circuitry, first electrode 812 is provided with a source current that flows through nonlinear electrode layer 130, OUM material 820, OTS material 830, and second electrode 840. The device voltage vs. current behavior is shown in detail with respect to FIG. 2B. First electrode 812 is typically supplied with a current through first interconnect 104. However, other configurations are also possible as are known to those skilled in the art. When OUM material 820 is heated between first electrode 812 and second electrode 840, the resulting region (herein discussed as active region 190) behaves as the data storage region of the device at active region 190. When active region 190 is heated and then cooled slowly, active region 190 may cool in a crystalline "set" state, which is a low resistance state. When active region 190 is heated and cooled rapidly, active region 190 may cool in an amorphous "reset" state, which is a high resistance state. The device resistance is read between electrodes 812, 840 to determine the "set" or "reset" state.

Typically, the "reset" state is where active-region 190 of the phase-change material of OUM material 820 is in a substantially amorphous state. Alternatively, in a "set" state active-region 190 may be in a substantially crystalline state or a state that includes a contiguous crystalline pathway that extends across OUM material 820. Surrounding portions of OUM material 820 may be substantially crystalline, which allows for improved conductivity with first and second electrodes 812, 840. When reading phase-change memory device 802, a current is passed through active-region 190 via first and second electrodes 812, 840 and the conductivity (or resistivity) is compared with a reference resistance to determine the "set" or "reset" state. In general, the resistivity of the phase-change material is greater when active-region 190 is in the substantially amorphous state and is reduced when in the substantially crystalline state. Assignment of logic states (used with circuits and/or devices that use phase-change memory device 802) to the "set" and "reset" states may be arbitrary. However, typical conventions include assigning a logic "1" to the substantially crystalline state and a logic "0" to the substantially amorphous state is one example. Conversely, the opposite may be assigned.

In order for phase-change memory device 802 to change states, electrical current is formed between first and second electrodes 812, 840 through active-region 190. The current heats the active material (e.g., the phase-change material) until it is amorphous. Once in an amorphous viscous state, quick cooling of active-region 190 relaxes active-region 190 to a substantially amorphous state. Alternatively, relatively slower cooling of active-region 190 may cause active-region 190 to relax to a partially or substantially crystalline state.

Capping insulator 170 and lower isolation layer 101 substantially prevent leakage of current from memory device 802 to surrounding structures. When a source current is provided between first electrode 812 and second electrode 840, an electrical circuit path is formed from first electrode 812 through nonlinear electrode 130, OUM material 820, OTS material 830, and to second electrode 840. Because electrodes 812, 840 are opposite each other relative to OUM material 820, there is a substantially direct (e.g., vertical) flow of current. That is to say, the current density of the source current is substantially vertical from first electrode 812 to second electrode 840 with minimal dispersion through OUM material 820. Note that insulator layer 140, which surrounds OUM material 820, inhibits lateral flow of current.

A pore 822 is configured through a first intermediate insulation layer 140. Pore 822 may have sloped walls to facilitate the deposition of OUM material 820 as well as reducing the contact area of OUM material 820 with nonlinear electrode layer 130. In general, the resistance of nonlinear electrode layer 130 is high enough to provide isolation between adjacent phase-change memories 802, 804, 806. In contrast, OUM material 820 and OTS material 830 are separated from the adjacent phase-change memories 802, 804, 806 by second intermediate insulation layer 850 and third intermediate insulation layer 852.

Figure 2B:
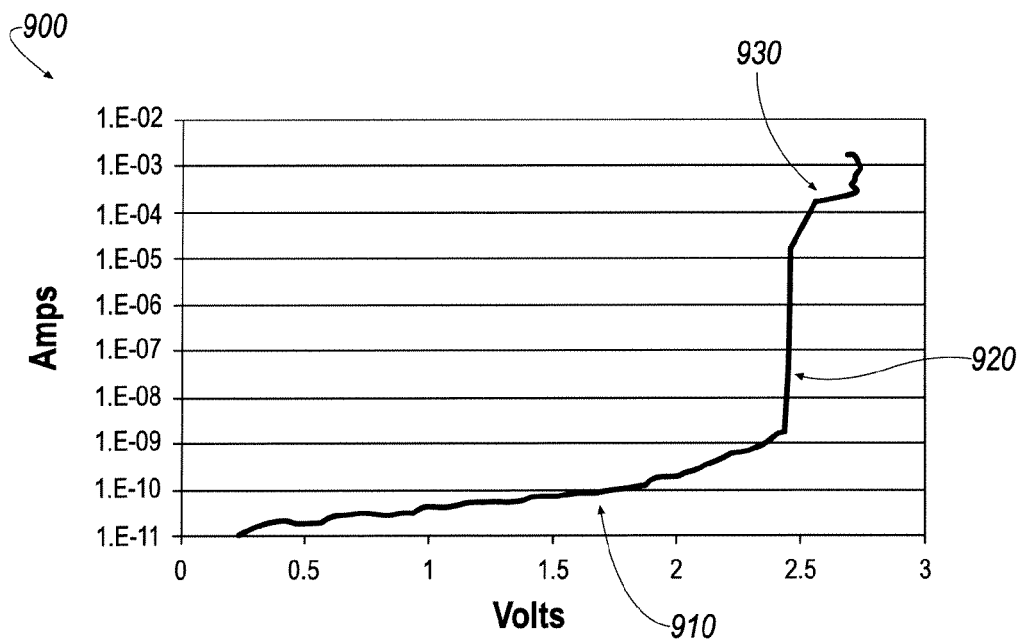
FIG. 2B is a chart of the I-V characteristics of the device of FIG. 2A.

FIG. 2B is a chart 900 of the I-V characteristics of memory device 802 of FIG. 2A. The overall I-V characteristics of the combination of nonlinear electrode layer 130, and OTS material 830 in series with OUM material 820 provides that memory device 802 operates in a "wingless" manner. The combination of materials does not suffer high leakage (described below in detail with respect to FIG. 8A) and does not have a "snapback" effect (as described above in connection with FIG. 1). The combination of OTS material 830 and nonlinear electrode 130 provide both the isolation and rapid increase in current at a predetermined trigger voltage without the snapback of voltage after reaching the trigger voltage (e.g., at around 2.5 volts as shown in FIG. 2B). Chart 900 shows a resistive branch 910 that has a generally linear I-V curve leading up to a predetermined trigger voltage of about 2.5 volts. When memory device 802 reaches the trigger voltage (at around 2.5 volts) between first electrode 812 and second electrode 840, current increases rapidly along a transitional curve 920. After the rapid increase in current, voltage and current increase to a conductive branch 930. Of note is that as voltage increases, current also generally increases. Chart 900 does not show a "snapback" effect wherein voltage decreases while current increases or remains the same.

The wingless operation depicted in chart 900 is a consequence of the series combination of OTS material 830 and nonlinear resistive material 130. In the absence of nonlinear resistive material 130, OUM material 820 would experience the snapback in voltage and accompanying abrupt increase in current depicted in FIG. 1 due to the transformation of OTS material 830 from a resistive state to a conductive state. Inclusion of nonlinear resistive material 130 prevents the snapback by controlling the resistance of the series combination upon switching of OTS material 830. When OTS material 830 switches, it becomes highly conductive and significantly less resistive than nonlinear resistive material 130. As a result, nonlinear resistive material 130 buffers the discontinuity in current and voltage that accompanies the switching of OTS material 830.

The overall effect of nonlinear resistive material 130 on the I-V characteristics measured between first electrode 812 and second electrode 840 upon switching depends on the relationship of the threshold voltage of OTS material 830 to the turn-on voltage of nonlinear resistive material 130. If the threshold voltage of OTS material 830 is below the turn-on voltage of nonlinear resistive material 130, the combined resistance in series with OUM material 820 becomes approximately the resistance of nonlinear resistive material 130 in its pre-turn-on state when OTS material 830 initially switches. As illustrated below, the pre-turn-on resistance of nonlinear resistive material 130 is generally lower than the off state resistance of OTS material 830, but considerably higher than the on state resistance of OTS material 830. Accordingly, OUM material 820 may experience a discontinuity in current or voltage when OTS material 830 switches, but the discontinuity is attenuated considerably relative to a series combination of OUM material 820 and OTS material 830 without nonlinear resistive material 130.

If the threshold voltage of OTS material 830 is above the turn-on voltage of nonlinear resistive material 130, the combined resistance in series with OUM material 820 becomes approximately the resistance of nonlinear resistive material 130 in its turn-on state when OTS material 830 initially switches. The turn-on state resistance of nonlinear resistive material 130 is much lower than the pre-turn-on state resistance and may be comparable to or lower than the resistance of the on state of OTS material 830.

To minimize the disturbance in current or voltage experienced by OUM material 820, it is desirable to design the series combination so that the threshold voltage of OTS material 830 is comparable to the turn-on voltage of nonlinear resistive material 130. In this situation, nonlinear resistive material 130 turns on at approximately the threshold voltage of OTS material 830 and a relatively continuous change in the current or voltage is experienced by OUM material 820 when the threshold voltage of OTS material 830 is reached. The threshold voltage of OTS material 830 can be adjusted by varying its thickness or chemical composition. Similarly, the turn-on voltage of nonlinear resistive material 130 can be adjusted by varying its thickness or chemical composition. In one embodiment, the thickness of nonlinear resistive material 130 is set so that the turn-on voltage and threshold voltage differ by less than 1.0 V. In another embodiment, the thickness of nonlinear resistive material 130 is set so that the turn-on voltage and threshold voltage differ by less than 0.5 V. In still another embodiment, the thickness of nonlinear resistive material 130 is set so that the turn-on voltage and threshold voltage differ by less than 0.25 V. In a further embodiment, the thickness of nonlinear resistive material 130 is set so that the turn-on voltage and threshold voltage differ by less than 0.1 V.

The I-V characteristics shown in chart 900 of FIG. 2B illustrate the response of the series combination of FIG. 2A that includes nonlinear electrode 130, OUM material 820 and OTS material 830 when the threshold voltage of OTS material 830 and the turn-on voltage of nonlinear resistive material 130 are both approximately 2.5 V. The I-V response shows a continuous increase in current as the voltage approaches and exceeds 2.5V. Inclusion of nonlinear resistive material 130 leads to an elimination of a switchback effect.

Figure 2C:
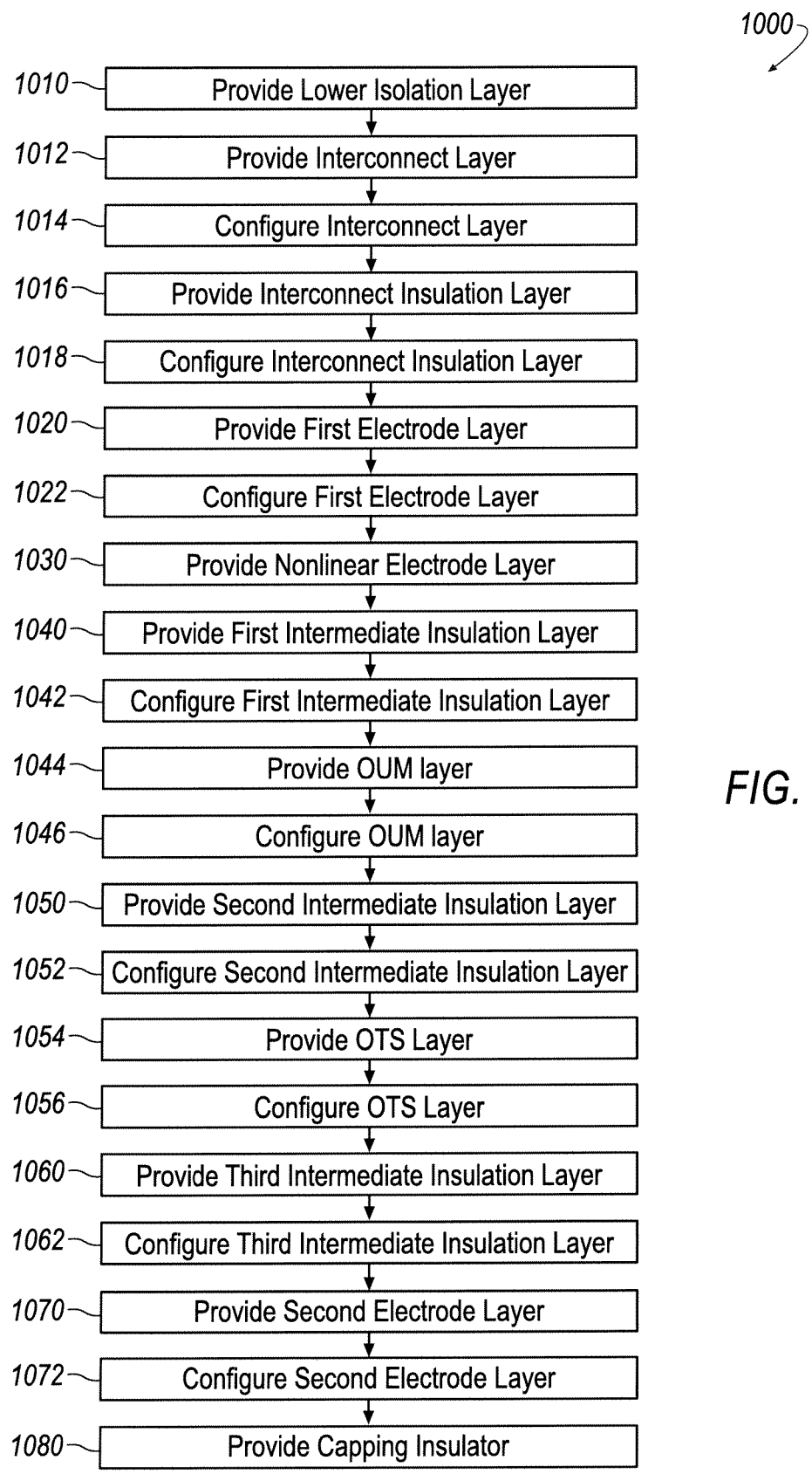
FIG. 2C is an example of a manufacturing process for the phase-change memory device of FIG. 2A.

FIG. 2C is a flow diagram 1000 of a method of manufacturing phase-change memory device 802 of FIG. 2A. In step 1010, lower isolation layer 101 is provided. Lower isolation layer 101 may be made of silicon dioxide (SiO$_2$), other oxide, silicon nitride (Si$_3$N$_4$ or SiN$_x$), other nitride, or other insulator, and may be deposited by techniques such as chemical vapor deposition (CVD), metal-organic chemical vapor deposition (MOCVD), sputtering, physical vapor deposition (PVD), atomic layer deposition, selective deposition or other deposition methods generally known in the art. The lower isolation layer generally provides electrical and thermal isolation from any structures that memory device 802 may be constructed on top of. Thermal isolation is provided so that device operating heat is not leaked to adjacent structures and remains concentrated at OUM material 820, thus minimizing the energy required during operation to create or maintain a particular level of heating within the phase-change layer. Further, lower isolation layer 101 may be provided on top of a wafer that includes semiconductor elements where memory device 802 is to be constructed above or within typical interconnect strata. That is to say, the lower isolation layer may be provided on top of a substrate that contains circuits and systems that are to be used in conjunction with memory device 802 or otherwise. Alternatively, the lower isolation layer may itself be a glass or silicon wafer of suitable properties for constructing phase-change memory array 800, including memory device 802.

Next, in step 1012, first interconnect 104 is provided. First interconnect 104 is typically a conductive material, such as a metal, metal alloy, or metal-containing compound (e.g. W, Ti, TiAlN, TiSiN, TiN, MoN) or carbon and may be a homogeneous, layered, or composite material. First interconnect 104 may be deposited by chemical vapor deposition (CVD), metal-organic chemical vapor deposition (MOCVD), sputtering, physical vapor deposition (PVD), atomic layer deposition, selective deposition or other deposition methods generally known in the art. As phase-change memory array 800 may be constructed between steps in a semiconductor process, first interconnect 104 may be deposited along with other interconnect lines for other circuitry constructed on the substrate.

Next, in step 1014, first interconnect 104 is configured. In particular, first interconnect 104 is patterned by reactive ion etching (RIE) to create separate interconnects 104 from the deposited layer. The patterning may also create bus lines and/or interconnects to support circuitry.

Next, in step 1016, an interconnect insulator 102 is provided as a layer that covers first interconnect 104. Interconnect insulator 102 may comprise a material such as silicon dioxide (SiO$_2$), other oxide, silicon nitride (Si$_3$N$_4$ or SiN$_x$), other nitride or other insulator. Interconnect insulator 102 may be deposited by chemical vapor deposition (CVD), metal-organic chemical vapor deposition (MOCVD), sputtering, physical vapor deposition (PVD), atomic layer deposition, selective deposition or other deposition methods generally known in the art.

Next, in step 1018, interconnect insulator 102 is configured and excess material from the deposition of interconnect insulation layer 102 is removed. Interconnect insulation layer 102 is formed using a deposition across the entirety of the surface of first interconnect 104 and over lower isolation layer 101. Thus, the excess material that is above first interconnect 104 is to be removed so that first interconnect 104 is not covered by insulative material. The excess insulator material is removed using a chemical mechanical polishing (CMP) process. Generally, the horizontal surface of interconnect insulation layer 102 is cleaned by removing the excess material to provide a generally planar surface. When complete, first interconnect 104 remains as exposed for electrical connection to first electrode 812 (provided in later steps).

Next, in step 1020, first electrode 812 is provided, for example, as a metal, metal alloy, metal-containing compound (e.g. Ti, TiAlN, TiSiN, TiN, MoN) or carbon and may be deposited by CVD, sputtering or evaporation. First electrode 812 may be a homogeneous, layered, or composite material. First electrode 812 is formed at least in part over first interconnect 104 and may extend over part of interconnect insulator 102. First electrode 812 electrically communicates with first interconnect 104 and provides the read/write access to phase-change memory array 800.

Next, in step 1022, first electrode 812 is configured. First electrode 812 may be patterned to isolate adjacent devices in an array (e.g., phase-change memory array 800 shown in FIG. 1A). The patterning may provide gaps where first electrode insulator 810 will be deposited to provide isolation. In an example, first electrode 812 may be patterned by reactive ion etching (RIE) to create separate first electrodes 812 from the deposited layer. In an alternate embodiment, first interconnect 104 may be used directly as the lower electrode of the device and the step of providing and configuring first electrode 812 may be omitted.

Next, in step 1024, first electrode insulator 810 is provided in a layer. The gaps provided in step 1022 are filled to provide isolation between adjacent first electrodes 812 in an array. First electrode insulator 810 may be a SiO$_2$ (silicon dioxide) material and may be deposited by chemical vapor deposition (CVD), physical vapor deposition (PVD), or grown from a silicon film. For improved performance, first electrode insulator 810 may be selected for reduced thermal conductivity. Preferably, the thermal conductivity is less than that of SiO$_2$ (silicon dioxide) to provide increased retention of heat in OUM material 820 during programming operations. Alternative materials for first electrode insulator 810 may include, but are not limited to, carbide materials, nitride materials, aerogels, xerogels and their derivatives and composites. Typically, first electrode insulator 810 may comprise a material such as silicon dioxide (SiO$_2$) or silicon nitride (Si$_3$N$_4$ or SiN$_x$). In a preferred embodiment, silicon dioxide (SiO$_2$) is used. In a more preferred embodiment, silicon nitride (Si$_3$N$_4$ or SiN$_x$) is used.

Next, in step 1026, first electrode insulator 810 is configured. CMP may be used to planarize first electrode insulator 810 to expose first electrode 812. Planarization may be used to provide a flat surface for the deposition of nonlinear electrode layer 130. Moreover, planarization allows for the removal of excess insulator material that may cover and prevent electrical contact with first electrode 812. After configuration, the excess material is removed to expose first electrode 812.

In an alternative embodiment, first electrode 812 may be formed by first forming first electrode insulator 810 on interconnect insulator 102 and first interconnect 104 and then patterning and etching first electrode insulator 810 to provide openings into which first electrode 812 is deposited. The structure may then be planarized by CMP to remove portions of the material used to form first electrode 812 that are deposited on the top surface of first insulator 810.

Next, in step 1030, nonlinear electrode layer 130 is provided. Nonlinear electrode 130 is provided as a layer that may be deposited to a thickness of about 200 Å (two hundred angstroms) to about 600 Å (six hundred angstroms) in a film. Isolation of nonlinear electrode layer 130 for each memory device 802, 804, 806 may not be necessary because nonlinear electrode 130 has a sufficiently high resistance in its pre-turnon state to that provide adequate isolation of individual devices in a memory array. However, if desired, nonlinear electrode layer 130 may be patterned or otherwise configured to achieve physical separation from other devices. Portions of nonlinear electrode layer 130 removed in the configuration process may be replaced by an insulator material to achieve isolation.

Carbon-nitrogen alloys ($C_{1-x}N_x$, which may also be referred to herein as carbon nitride or a carbon nitride material) are illustrative examples of a nonlinear resistive electrode materials. An example of a method for creating nonlinear electrode 130 as a carbon-nitride material includes introducing nitrogen gas into a PVD chamber that may also include argon as a carrier or background gas. Nitrogen is generally fed into a vacuum chamber at a volumetric flow rate of approximately thirty to seventy percent of the volumetric flow rate of argon. In an alternative embodiment, the volumetric flow rate of nitrogen is about sixty percent of the volumetric flow rate of argon. Nonlinear electrode 130 may also subjected to an annealing step following deposition that may include slow and/or rapid thermal annealing to modify the properties (see discussion below).

Nonlinear electrode 130 may be prepared by combining nitrogen gas and vaporized carbon. The carbon component used to form the electrodes may be vaporized by a variety of known techniques, such as physical vapor deposition (PVD), chemical vapor deposition (CVD), and plasma enhanced CVD. However, it is preferably vaporized by sputtering a carbon target with an ionized gas. Because nonlinear electrode 130 is a deposition product formed by mixing nitrogen gas and vaporized carbon, it may have a substantially uniform composition along its thickness, resulting in generally uniform electrical characteristics throughout. The relative feed rates of nitrogen and argon in a carbon sputtering process, and the relative proportions of carbon and nitrogen in the deposited material, can have an effect on the resistivity of the resulting nonlinear electrode.

In another example, nonlinear electrode 130 may include nitrogenated carbon prepared by sputtering (e.g. physical vapor deposition) a target comprising both carbon and nitrogen. The relative amounts of carbon and nitrogen in the target influence the proportion of carbon and nitrogen in the deposited material and control over the resistivity of the resulting carbon-nitrogen nonlinear electrode may thereby be achieved. The atomic percent of the carbon (of the target) may be greater than the atomic percent of the nitrogen (of the target). In a number of examples, the atomic percent of the carbon may be greater than or equal to about 50%, about 60%, about 70%, about 80%, and about 90%.

Next, in step 1040, first intermediate insulation layer 140 is provided. First intermediate insulator 140 may be a $SiO_2$ (silicon dioxide) material and may be deposited by chemical vapor deposition (CVD), physical vapor deposition (PVD), solution deposition, or grown from a silicon film. For improved performance, first intermediate insulator 140 may be selected for reduced thermal conductivity. Alternative materials for first intermediate insulator 140 may include, but are not limited to, carbide materials, nitride materials, aerogels, xerogels and their derivatives and composites. Typically, first intermediate insulator 140 may comprise a material such as silicon dioxide ($SiO_2$) or silicon nitride ($Si_3N_4$ or $SiN_x$). In one preferred embodiment, silicon dioxide ($SiO_2$) is used. In another preferred embodiment, silicon nitride ($Si_3N_4$ or $SiN_x$) is used.

Next, in step 1042, first intermediate insulation layer 140 is configured to create pore 822. In this step, a hole is etched through first intermediate insulation layer 140 to expose nonlinear electrode layer 130 using, e.g., reactive ion etching (RIE) or a chemical etch with appropriate masking techniques (such as photolithography).

Next, in step 1044, OUM material 820 is provided in a layer as an active material. Typically, GST225 (discussed in detail above) is deposited in a layer. Other phase-change or switching materials may also be used as discussed above with respect to FIG. 2A, including programmable resistance materials, chalcogenide alloys or pnictide alloys. The surface of first intermediate insulator 140 is generally planer with pores made therein to receive OUM material 820. Thus, active OUM material 820 is provided as a layer, filling each pore 822, and being in electrical communication with nonlinear electrode layer 130.

Next, in step 1046, OUM layer 820 is configured. CMP may be performed to planarize OUM material 820 to the level of first intermediate insulation layer 140. The planarization provides a flat surface for construction of other structures above this layer.

Next, in step 1050, second intermediate insulation layer 850 is provided in a layer. Second intermediate insulator 850 may be a $SiO_2$ (silicon dioxide) material and may be deposited by chemical vapor deposition (CVD), physical vapor deposition (PVD), solution deposition, or grown from a silicon film. For improved performance, second intermediate insulator 850 may be selected for reduced thermal conductivity. Alternative materials for second intermediate insulator 850 may include, but are not limited to, carbide materials, nitride materials, aerogels, xerogels and their derivatives and composites. Typically, second intermediate insulator 850 may comprise a material such as silicon dioxide ($SiO_2$) or silicon nitride ($Si_3N_4$ or $SiN_x$). In one embodiment, silicon dioxide ($SiO_2$) is used. In another preferred embodiment, silicon nitride ($Si_3N_4$ or $SiN_x$) is used.

Next, in step 1052, second intermediate insulation layer 850 is configured. In this step, a hole is etched through second intermediate insulation layer 850 to expose OUM material 820 using, e.g., reactive ion etching (RIE) or a chemical etch with appropriate masking techniques (such as photolithography). Preferably, the method used to etch second intermediate insulation layer 850 does not damage OUM material 820.

Next, in step 1054, OTS material 830 may be formed in a sputtering or chemical vapor deposition process on OUM material 820. OTS material 830 is electrical communication in series with OUM material 820.

Next, in step 1056, OTS material 830 is configured. To remove excess material that may be covering third intermediate insulation layer 852 (because OTS material was deposited in a layer), CMP may be used to remove excess OTS material 830. The resultant configuration provides a generally planar surface including isolated regions of OTS material 830 between the holes configured through second intermediate insulation layer 850.

Next, in step 1060, third intermediate insulation layer 852 is provided. Third intermediate insulator 852 may be a $SiO_2$ (silicon dioxide) material and may be deposited by chemical vapor deposition (CVD), physical vapor deposition (PVD), solution deposition or grown from a silicon film. For improved performance, third intermediate insulator 852 may be selected for reduced thermal conductivity. Alternative materials for third intermediate insulator 852 may include, but are not limited to, carbide materials, nitride materials, aerogels, xerogels and their derivatives and composites. Typically, third intermediate insulator 852 may comprise a material such as silicon dioxide ($SiO_2$) or silicon nitride ($Si_3N_4$ or $SiN_x$). In one embodiment, silicon dioxide ($SiO_2$) is used. In another embodiment, silicon nitride ($Si_3N_4$ or $SiN_x$) is used.

Next, in step 1062, third intermediate insulation layer 852 is configured. In this step, a hole is etched through third intermediate insulation layer 852 to expose OTS material 830 using, e.g., reactive ion etching (RIE) or a chemical etch with appropriate masking techniques (such as photolithography). Preferably, the method used to etch third intermediate insulation layer 852 does not damage OTS material 830.

Next, in step 1070, second electrode 840 is provided. Typically, second electrode 840 is a metal (e.g., Cu), metal alloy, metal containing compound, or carbon and is deposited by CVD, sputtering or evaporation. Second electrode 840 may be a homogeneous, layered, or composite material. When deposited, second electrode 840 provides a layer that electrically communicates with OTS material 830. If desired (but not shown), second electrode 840 may be further patterned to separate each memory device 802, 804, 806 from adjacent memory devices when produced in an array.

Next, in step 1072, second electrode 840 is configured. Although an optional step, planarization of second electrode 840 may be desirable so that capping insulator 170 may be applied in a constant thickness layer if other circuitry is to be constructed over memory device 802. In an example, the planarization of second electrode 840 may be performed by CMP.

Next, in step 1080, capping insulator 170 is provided to isolate phase-change memory array 800 electrically and thermally from other circuits or structures that may be constructed over or adjacent to phase-change memory array 800. Capping insulator 170 may be made of $SiO_2$ (silicon dioxide), or other insulators, and may be deposited by techniques such as chemical vapor deposition (CVD) or solution phase deposition (e.g. TEOS or colloidal silica deposition followed by gelation and annealing). As is known in the art, $SiO_2$ (silicon dioxide) is a common insulator in semiconductor device technology.

Figure 3:
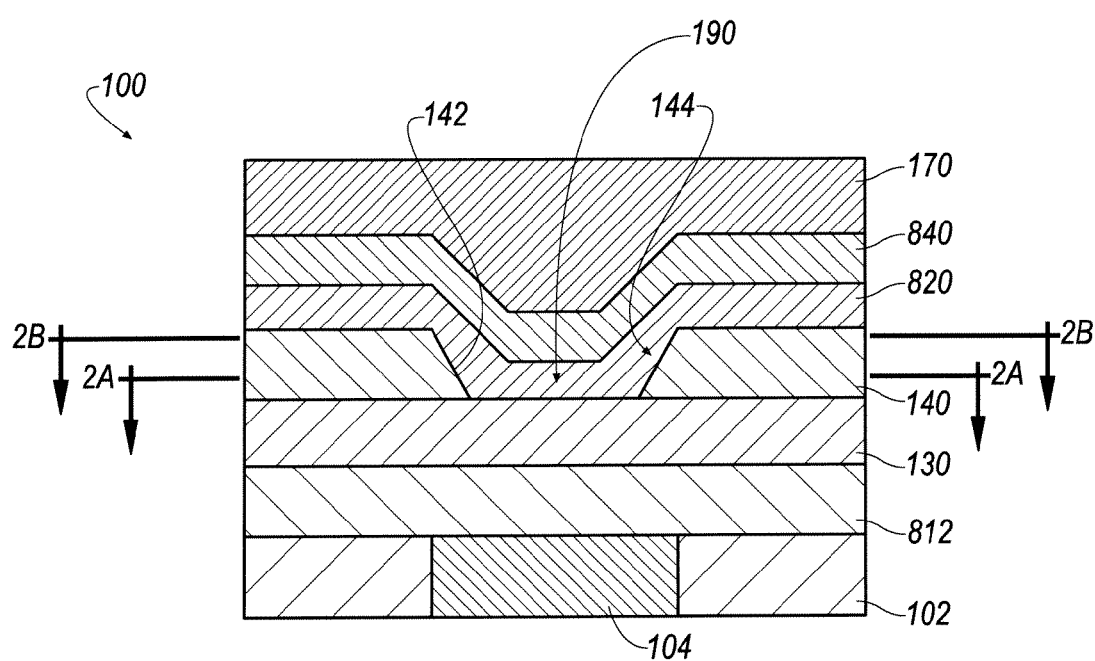
FIG. 3 is a cross-sectional view of a phase-change memory device.

FIG. 3 is a cross-sectional view of an active material device 100 that includes a programmable resistance material and nonlinear electrode without an OTS device. The programmable resistance material 820 is a phase-change layer or OUM material that directly contacts nonlinear electrode 130. In the design of device 100, the thickness of OUM material 820 is less than the thickness of first intermediate insulator 140 and no planarization of OUM material 820 was completed. Second electrode 840 is deposited directly over OUM material 820 without planarization. Capping insulator 170 is formed over second electrode 840. First electrode 812 and second electrode 840 are used to access device 100. The various layers associated with device 100 may be formed as described hereinabove in connection with FIG. 1C. Device 100 is provided to show the electrical characteristics of an OUM device with a nonlinear electrode (e.g., without OTS material in series).

Figure 3A:
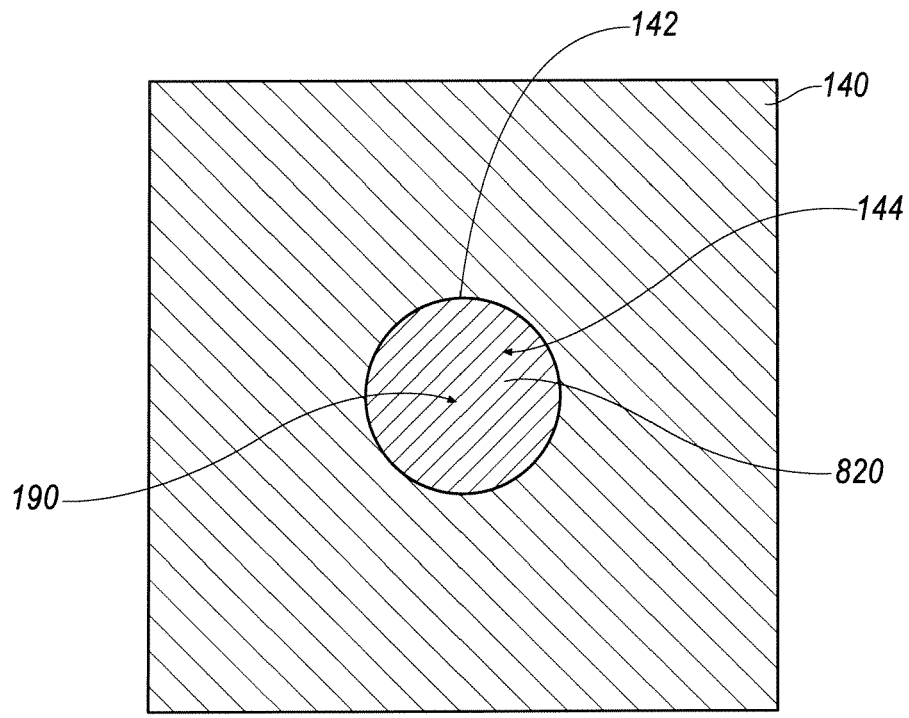
FIG. 3A is a cross-sectional view of an active material in a pore taken from section lines 3A of FIG. 3.

FIG. 3A is a cross-sectional view of OUM material 820 in a pore 144 taken from section lines 3A of FIG. 2. OUM material 820 is deposited within pore 144. Active material region 190 is generally circular or round and is generally defined by the size and shape of a pore periphery 142 (see also FIG. 3). First intermediate insulator 140 electrically and thermally insulates OUM material 820 (see FIG. 3) and active material region 190 from adjacent structures.

Figure 3B:
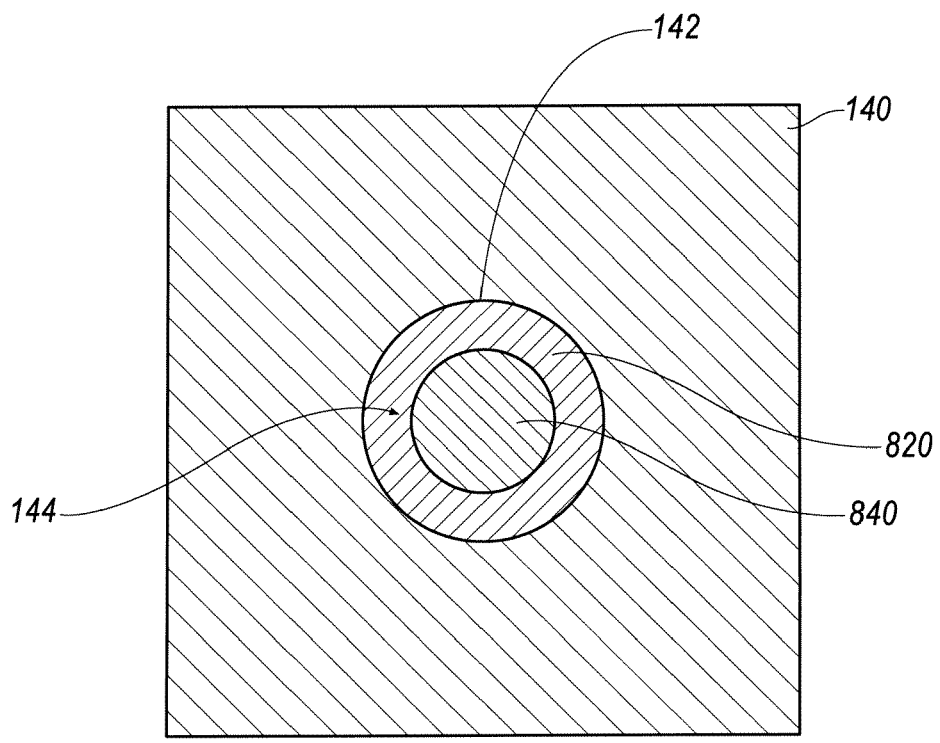
FIG. 3B is a cross-sectional view of an active material and an electrode in a pore taken from section lines 3B of FIG. 3.

FIG. 3B is a cross-sectional view of OUM material 820 and second electrode 840 in pore 144 taken from section lines 3B of FIG. 3. Shown in FIG. 3B, second electrode 840 is over OUM material 820. Because the thickness of OUM material 820 is less than the thickness of first intermediate insulator 140, a portion of second electrode 840 is within pore 144. Alternatively, the thickness of OUM material 820 may be the same thickness or thicker than first intermediate insulator 140, which would locate second electrode 840 above first intermediate insulator 140 (not shown).

Figure 4:
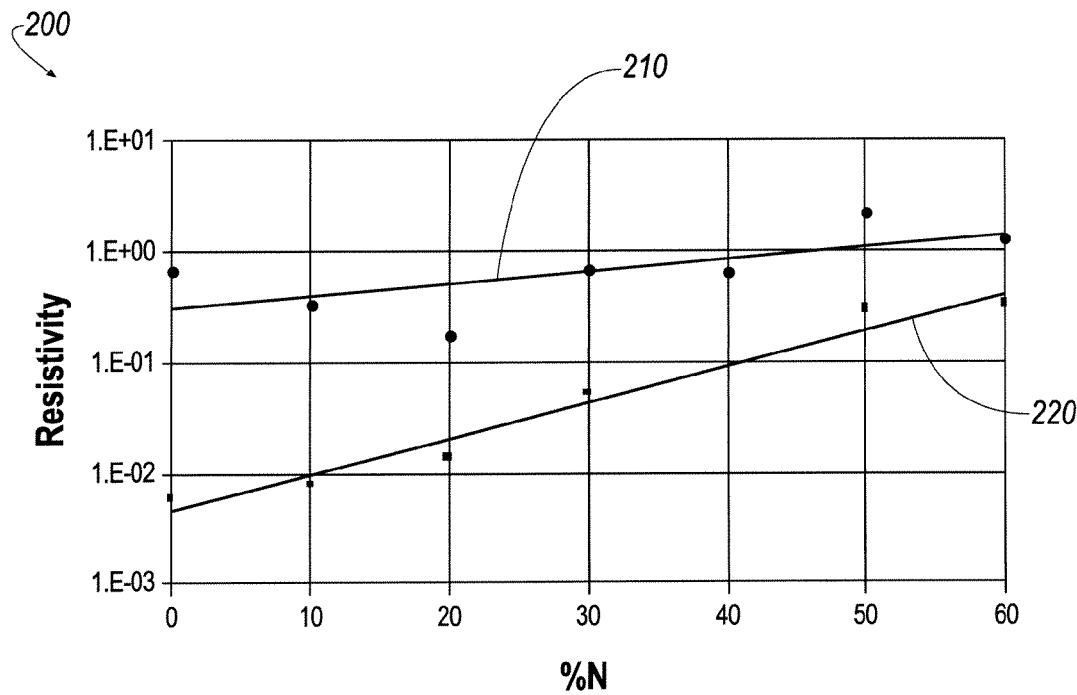
FIG. 4 is a chart illustrating resistivity related to the nitrogen content in a carbon-nitride material.

FIG. 4 is a chart illustrating resistivity related to nitrogen percentage in a carbon-nitride material, which may be used for nonlinear electrode 130 for the embodiments depicted in FIGS. 2A and 3 and for other embodiments within the scope of the instant invention. The data shown in FIG. 4 correspond to sheet resistivity measurements taken for a blanket film of the carbon-nitride material outside of a device structure. The carbon nitride nonlinear resistive material was prepared by reactively sputtering a carbon target in a nitrogen gas atmosphere in the presence of argon. The nitrogen content in the nonlinear resistive material was varied by varying the partial pressure of nitrogen gas in the sputtering environment. The partial pressure of nitrogen gas was varied between 0% and 60%, where the balance of the pressure was due to argon. The amount of nitrogen incorporated in the deposited carbon-nitrogen material is expected to increase as the partial pressure of nitrogen gas in the sputtering ambient increases.

Curve 210 of FIG. 4 shows the resistivity of the carbon-nitrogen material as a function of nitrogen partial pressure for the material in its as-deposited state after deposition at 180° C. (one hundred eighty degrees Celsius). Curve 220 of FIG. 4 shows the resistivity of the as-deposited carbon-nitrogen material after subjecting it to a rapid thermal anneal at 700° C. (seven hundred degrees Celsius). Curves 210 and 220 indicate that the resistivity of the carbon-nitrogen nonlinear resistive material generally increases with increasing nitrogen content and that the rapid thermal anneal treatment has the effect of lowering the resistivity. The rapid thermal anneal treatment simulates the conditions experienced by an active material device during fabrication. As indicated hereinabove, to achieve low programming currents of phase-change materials, it is desirable to have a high resistivity electrode adjacent to the phase-change material. A noteworthy observation from FIG. 4 is a diminishment of the decrease in resistivity of the carbon-nitrogen material upon annealing as the nitrogen content increases. In the case of the material formed in the presence of a 60% partial pressure of $N_2$, for example, the decrease in resistivity upon annealing is only about a factor of two. This indicates that carbon-nitrogen materials withstand processing conditions encountered in fabrication without significantly compromising their properties.

Figure 5:
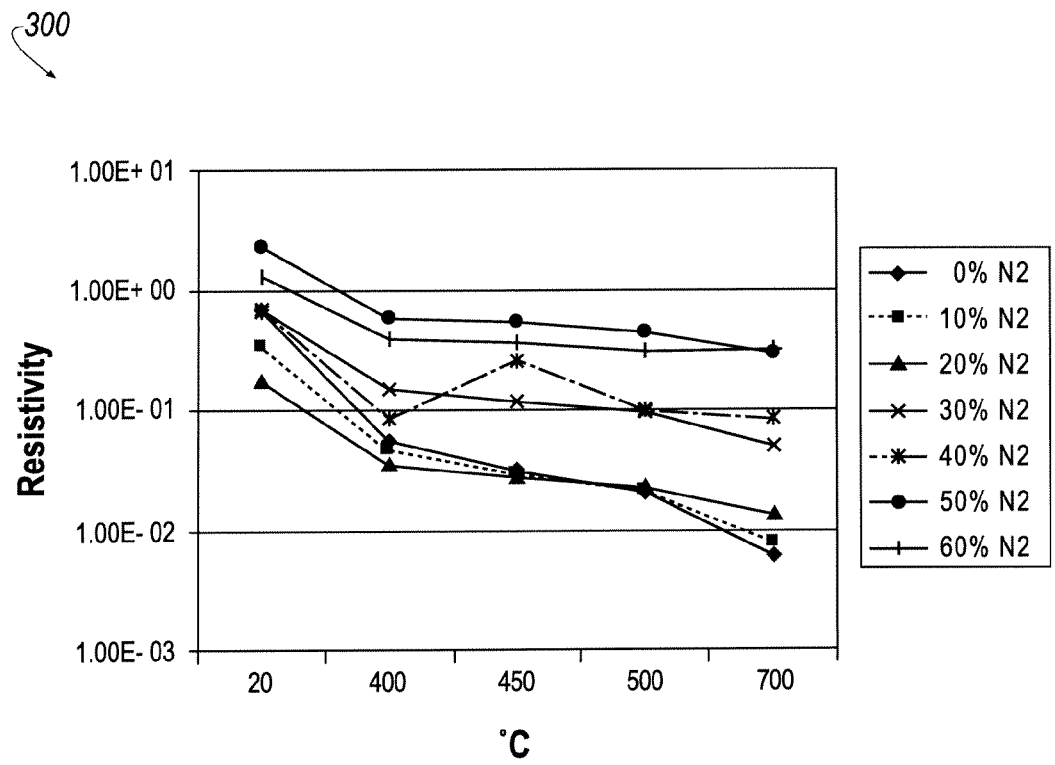
FIG. 5 is a chart illustrating resistivity and temperature for a variety of carbon-nitride materials.

FIG. 5 is a chart 300 illustrating resistivity as a function of the temperature at which rapid thermal annealing occurred for a variety of carbon-nitride materials. Each data point symbol represents a different nitrogen concentration as reflected by the partial pressure of nitrogen gas present in the sputtering environment of the carbon-nitride material. The legend shows the symbols associated with 0%, 10%, 20%, 30%, 40%, 50%, and 60% nitrogen partial pressure. Chart 300 shows that the resistivity generally increases with an increase of nitrogen partial pressure. Moreover, chart 300 demonstrates that the thermal stability of a carbon nitrogen film improves as the percentage of nitrogen increases. The stability is demonstrated by the approximately constant variation in resistivity for materials prepared in a sputtering environment having a 30% or greater $N_2$ partial pressure for temperatures between about 400° C. (four hundred degrees Celsius) and about 700° C. (seven hundred degrees Celsius). In a comparison, the 60% $N_2$ (sixty percent nitrogen) partial pressure curve is flatter than the 10% $N_2$ (ten percent nitrogen) curve. Indeed, the 10% $N_2$ (ten percent nitrogen) partial pressure curve shows a resistivity decrease from about 0.50E−1 (zero point five times ten to the negative one) ohms to about 1.00E−2 (one point zero times ten to the negative two) ohms. The 60% $N_2$ (sixty percent nitrogen) partial pressure curve shows about the same resistivity across the range of temperatures from about 400° C. (four hundred degrees Celsius) through about 700° C. (seven hundred degrees Celsius).

Chart 300 is developed from experimental data related to temperature and various nitrogen percentages in a carbon-nitride film based on variations in the nitrogen partial pressure in the sputtering environment. Thus, as shown by the data for about 40% $N_2$ (forty percent nitrogen), there is some variation in the experimental data results that may be due to many environmental changes and/or measurement systems. Therefore, the data as shown by chart 300 is not an absolute determination of various properties of the carbon nitrogen film at different temperatures, but rather shows trend information and general properties of the film over various temperatures.

Figure 6:
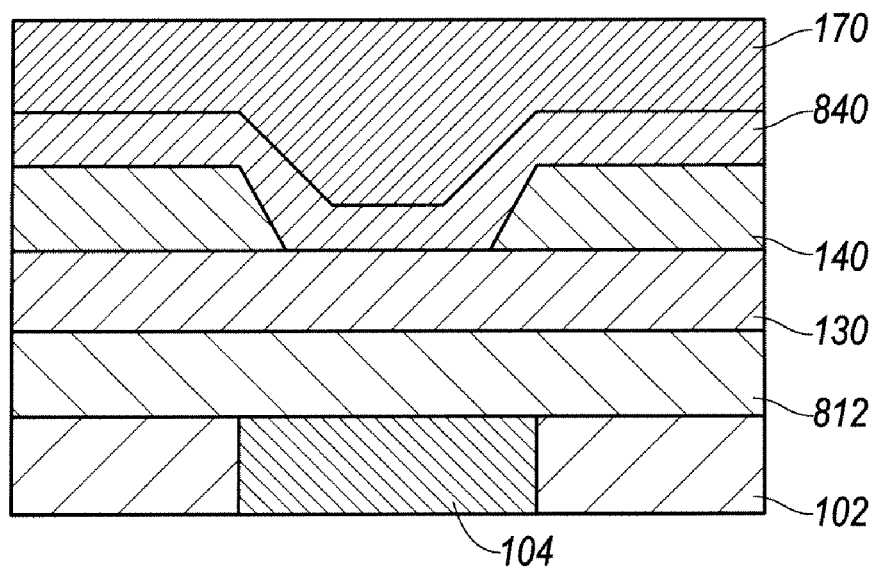
FIG. 6 is a cross-sectional view of an electrical device having a nonlinear resistive material between two electrodes.

FIG. 6 shows a cross-sectional view of a simplified device structure 600 used to demonstrate the nonlinear resistive properties of the carbon-nitrogen material included as the nonlinear resistive material in the device shown in FIG. 2A. Device 600 includes first interconnect 104, insulator 102, first electrode 812, nonlinear resistive material 130, dielectric 140, second electrode 840, and capping layer 170. Device 600 does not include an active material and is intended to illustrate the effect of a carbon-nitrogen nonlinear resistive material on the electrical characteristics of a simple two electrode structure. In operation to demonstrate the behavior of nonlinear electrode layer 130, current is passed through first interconnect 104, first electrode 812, nonlinear electrode layer 130, to second electrode 840.

Nonlinear resistive material 130 is a carbon-nitrogen material prepared by sputtering carbon at a deposition temperature of 180° C. in an argon-nitrogen environment in which the flow rate of nitrogen gas was 12 sccm ("standard cubic centimeters per minute") and the flow rate of argon gas was 20 sccm. Nonlinear resistive material 130 was deposited to a thickness of about 400 Å. First electrode 812 was a 300 Å thick sputtered TiN material and second electrode 840 was a sputtered dual layer material that included 300 Å of TiN and 500 Å of Ti. Dielectric 140 was a 1000 Å thick PECVD oxide material.

Figure 7:
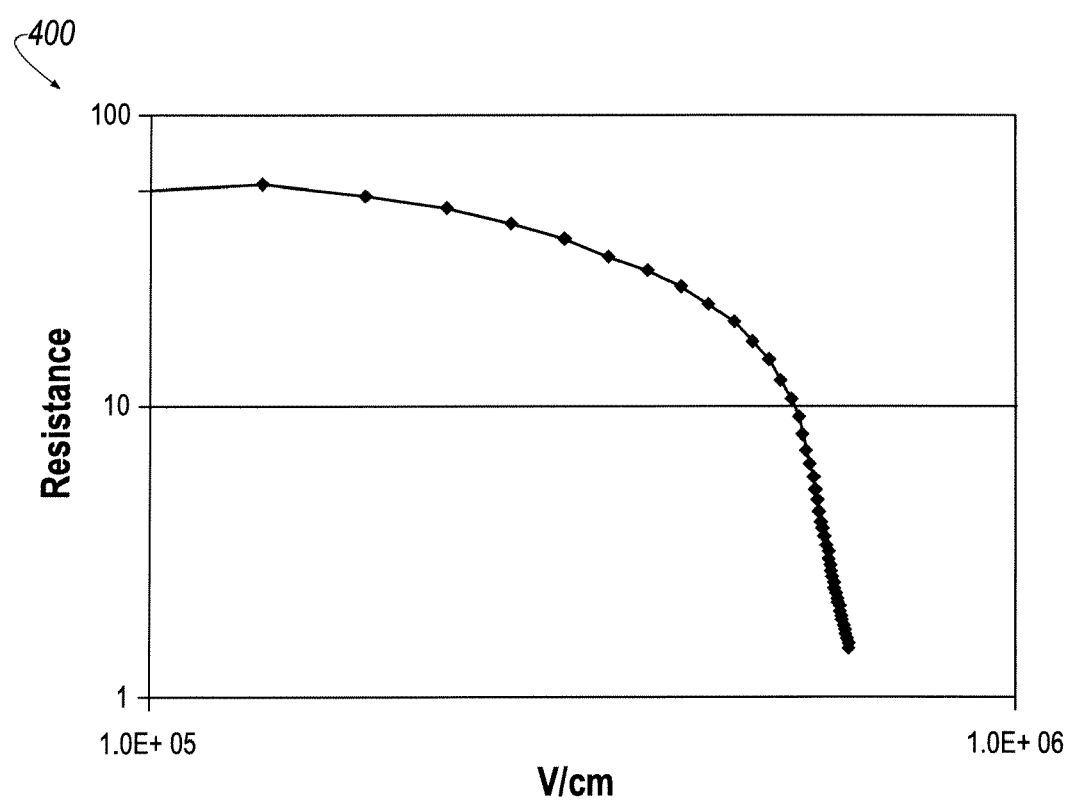
FIG. 7 is a chart illustrating electrical resistance of the device of FIG. 6 as a function of electric field.

FIG. 7 is a chart illustrating the resistance (in units of kΩ) of device 600 shown in FIG. 6 as a function of the electric field applied between first electrode 812 and second electrode 840. By way of empirical data, FIG. 6 shows that that the resistivity of the carbon-nitride nonlinear resistive electrode 130 is stable or slowly decreasing until the electric field approaches about 600 kV/cm (6.0E+05 V/cm). When the electric field exceeds about 6.0E+05 V/cm, the resistance of nonlinear electrode material begins to exhibit a pronounced decrease. In this example, the electric field strength of 6.0E+05 V/cm may be referred to as a critical field strength for the nonlinear resistive electrode material and the voltage at which the critical field strength is reached is referred to herein as the "turn-on" or "breakdown" voltage of the nonlinear resistive electrode material. When the voltage across the nonlinear resistive material reaches or exceeds the turn-on voltage, the resistance of the nonlinear resistive material decreases dramatically. The turn-on voltage marks a transition of the nonlinear resistive material from a high resistance "pre-turn-on state" to a conductive or low resistance turn-on state. In the embodiment depicted in FIG. 1, for example, the turn-on voltage was observed to be approximately 2.5V. As the voltage is increased above the turn-on voltage, the resistance of nonlinear resistive material 130 decreases rapidly. FIG. 7 indicates that nonlinear resistive material 130 transitions from a higher resistance pre-turn-on state to a lower resistance turn-on state without undergoing a snapback or experiencing a discontinuity in properties.

Figure 8:
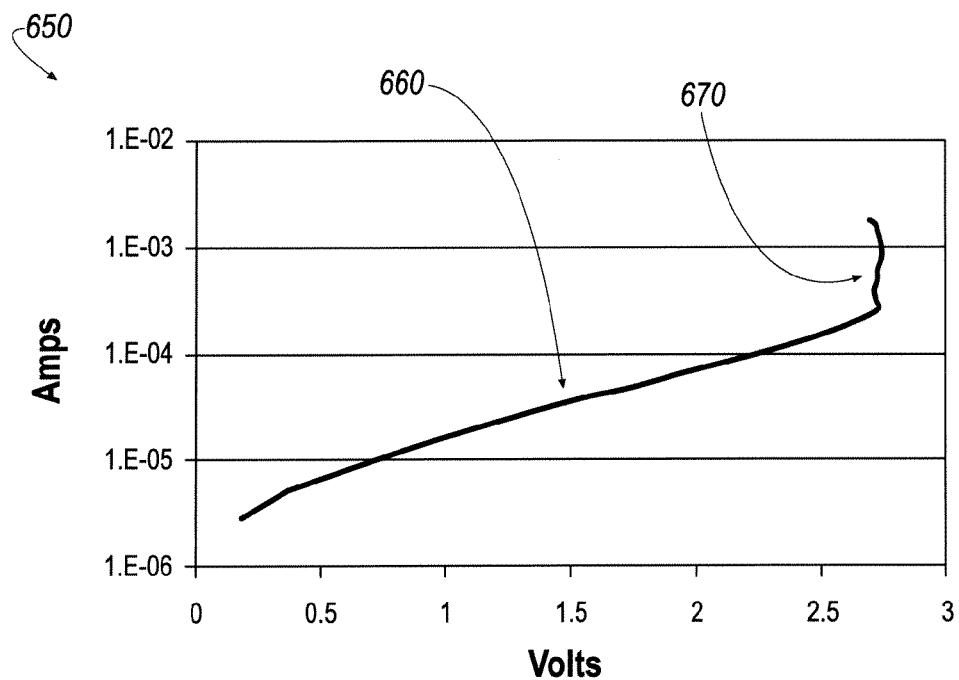
FIG. 8 is a chart of the I-V characteristics of the electrical device of FIG. 6 including a carbon-nitrogen nonlinear resistive layer between two electrodes.

FIG. 8 is a graph 650 of the I-V characteristics of electrical device 600 of FIG. 6. Graph 650 shows empirical data of the I-V characteristics of a device that includes a nonlinear resistive material 130 in series with two electrodes, where no active material is present in the device structure. I-V Graph 650 shows non-linear behavior at high electric fields, but no "snapback" to a lower voltage when the electric field is increased. For example, generally linear I-V behavior is exhibited in a first branch 660 from about 0.5 volts to about 2.7 volts. At about 2.7 volts (at around the breakdown voltage), a second branch 670 shows a rapid increase in current without a significant change in voltage. The data indicate that the turn-on voltage of nonlinear electrode layer 130 in device 600 is about 2.7 V and that the transition from the pre-turn-on state below about 2.7 V to the turn-on state above about 2.7 V occurs without a discontinuity or abrupt change in current or voltage.

Second branch 670 corresponds to the turn-on state of nonlinear electrode 130 and demonstrates that current increases rapidly and continuously at about the breakdown voltage, while the voltage across the device remains about the same. This behavior is different than a "snapback" behavior as shown schematically in FIG. 1 and described in further detail below with respect to FIG. 9. Device 600, which includes a non-linear resistive material in series with surrounding electrodes, exhibits the "wingless" behavior described hereinabove.

As indicated hereinabove, "wingless" behavior is desirable for an isolation device. Also desirable, however, is a low leakage current. The empirical data shown in FIG. 8 indicate that the resistance of nonlinear electrode material 130 in its pre-turn-on state is low enough to permit currents on the order of $10^{-5}$-$10^{-4}$ Amps to pass (see branch 660 of FIG. 8). Currents of this magnitude are sufficient to influence the state of an OUM, phase-change or other programmable resistance material. As a result, non-linear electrode 130, acting alone, is inadequate in providing isolation to active material devices in arrays.

Figure 9:
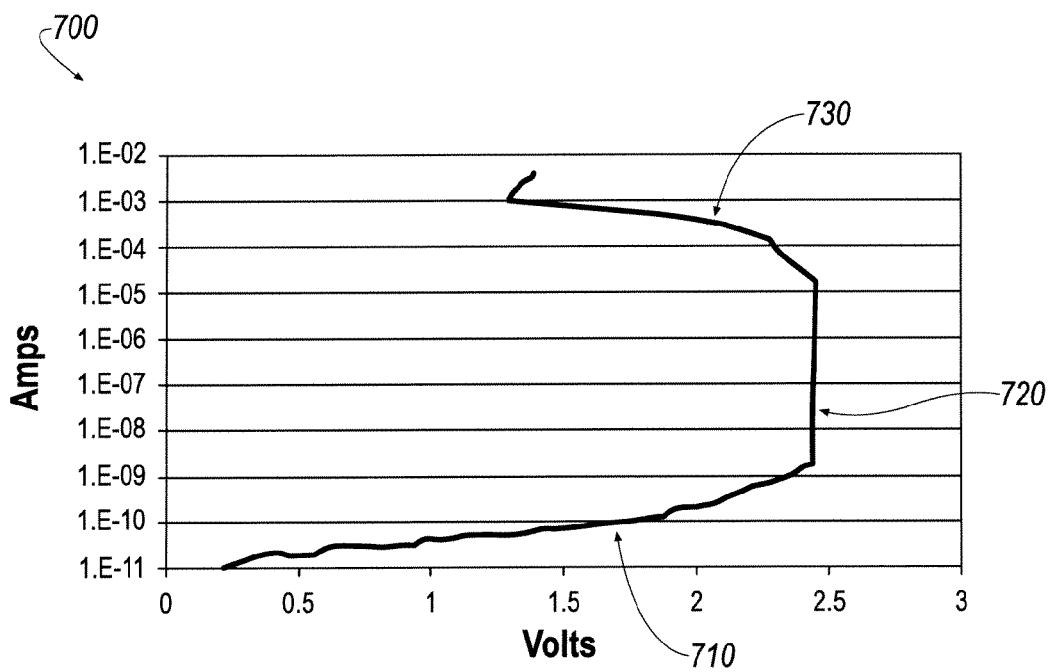
FIG. 9 is a chart of the I-V characteristics of a representative Ovonic Threshold Switch (OTS) device.

FIG. 9 is a chart 700 of the I-V characteristics of a typical Ovonic Threshold Switch (OTS) device. The OTS device includes an electrical switching chalcogenide material (prepared by sputtering a target made from an As—Te—Ge—Si—In alloy) that operates primarily in the amorphous phase without undergoing a phase transition to a crystalline phase. As described hereinabove, the OTS device undergoes a nearly discontinuous transformation from a resistive state to a conductive state upon application of a threshold voltage. The transformation is reversible upon relaxation of the voltage below the holding voltage and can be reinitiated by once again applying the threshold voltage.

FIG. 9 is included to better illustrate differences in the operational characteristics of an OTS device relative to the nonlinear electrode response depicted in FIG. 8. A first branch 710 is generally linear from about 0.25 volts to about 2.5 volts. The OTS device "snapback" is shown in FIG. 9 as a "wing" branch 730. When the voltage reaches the switching voltage of about 2.5 volts, current increases rapidly through transitional branch 720 while voltage remains the same. When the current increases to about 1.0E–05 Amps (dependent upon a variety of variables, materials, and device configuration), the "snapback" occurs over wing branch 730 and voltage drops to about 1.5 volts.

Of particular interest in FIG. 9 is the low leakage current displayed by the OTS device in its resistive "off" state (first branch 710). When in the "off" state, the resistance of the OTS device is sufficiently high to limit leakage current to a level of about $10^{-10}$ Amps. This level of leakage current is several orders of magnitude lower than that exhibited by the carbon-nitrogen nonlinear electrode material indicated in FIG. 8A. The OTS device thus provides better isolation of devices in an array than a standalone nonlinear resistive material.

As shown and described hereinabove, the instant invention provides an isolation scheme for OUM, phase-change, programmable resistance material and other active device arrays that provides the benefits of low leakage current and a continuous transition from an isolated ("off" or "non-selected") state to an "on" or "selected" state. In one embodiment, the isolation scheme includes a series combination of an OTS device and a nonlinear resistive or electrode material with an OUM, phase-change, programmable resistance material or other active material device. The nonlinear resistive or electrode material is generally a non-ohmic material that exhibits a transformation from a resistive state to a conductive state at a critical or turn-on voltage, where the transformation occurs without a discontinuity in voltage. The nonlinear resistive or electrode material operates reversibly and returns to its resistive state when the voltage is relaxed below the turn-on voltage. In another embodiment, the nonlinear resistive material is combined with a diode or transistor in series with an active material device. In addition to the OTS, other switchable materials or devices may be utilized in combination with an OUM, phase-change, programmable resistance material or other active material. Switchable materials or devices generally have a resistive state and a conductive state and transform between the resistive state and conductive state upon application of a critical voltage. In the case of an OTS, the critical voltage is the threshold voltage.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. An electrical device comprising:
   a first electrode;
   a second electrode;
   a first active material layer disposed between said first electrode and said second electrode, wherein said first active material layer includes
      a programmable resistance material,
      a phase-change material, or
      a chalcogenide material;
   a second active material layer disposed between said first electrode and said second electrode, wherein a lower surface of the second active material layer is disposed adjacent an upper surface of the first active material layer, wherein said second active material layer differs in composition from said first active material and includes
      a switchable material, said switchable material having
         a resistive state, and
         a conductive state, wherein said switchable material switches from said resistive state to said conductive state upon application of a critical voltage between said first electrode and said second electrode; and
   a nonlinear resistive material disposed between said first electrode and said second electrode and in direct contact with the first active material layer, said nonlinear resistive material being electrically in series with said first electrode, said first active material layer, said second active material layer, and said second electrode.

2. The electrical device of claim 1, wherein said first active material layer comprises one or more elements selected from the group consisting of Se and Te and one or more elements selected from the group consisting of Ge, Sb, In, and Bi.

3. The electrical device of claim 1, wherein said switchable material comprises
   a chalcogen element and one or more elements selected from the group consisting of Ge, As, Si, and In.

4. The electrical device of claim 1, wherein said switchable material is
   a threshold switching material, said threshold switching material having a threshold voltage, said threshold voltage corresponding to said critical voltage.

5. The electrical device of claim 1, wherein said switchable material switches from said conductive state to said resistive state upon removal of said critical voltage.

6. The electrical device of claim 1, wherein said nonlinear resistive material comprises
   carbon and nitrogen.

7. The electrical device of claim 6, wherein said nonlinear resistive material includes a sputtered carbon-containing material.

8. The electrical device of claim 7, wherein the sputtered carbon-containing material is formed in the presence of a gas phase ambient that includes nitrogen gas, wherein a partial pressure of said nitrogen gas in said gas phase ambient is at least 20%.

9. The electrical device of claim 7, wherein the sputtered carbon-containing material is formed in the presence of a gas phase ambient that includes nitrogen gas, wherein a partial pressure of said nitrogen gas in said gas phase ambient is at least 40%.

10. The electrical device of claim 1, wherein said nonlinear resistive material has a first state and a second state, said second state being more conductive than said first state, wherein, application of a turn-on voltage provides
means for transforming said nonlinear resistive material from said first state to said second state.

11. The electrical device of claim 10, wherein transformation from said first state to said second state occurs without a discontinuity in voltage or current.

12. The electrical device of claim 10, wherein transformation from said first state to said second state occurs at an approximately constant voltage.

13. The electrical device of claim 10, wherein transformation from said first state to said second state is accompanied by an increase in current.

14. The electrical device of claim 10, wherein a thickness of said nonlinear resistive material is such that said turn-on voltage and said critical voltage differ by less than 1 volt.

15. The electrical device of claim 10, wherein a thickness of said nonlinear resistive material is such that said turn-on voltage and said critical voltage differ by less than 0.5 volt.

16. The electrical device of claim 10, wherein a thickness of said nonlinear resistive material is such that said turn-on voltage and said critical voltage differ by less than 0.1 volt.

17. The electrical device of claim 10, wherein said first state of said nonlinear resistive material is more conductive than said resistive state of said switchable material.

18. The electrical device of claim 17, wherein said first state of said nonlinear resistive material is less conductive than said conductive state of said switchable material.

19. The electrical device of claim 1, wherein said first active material layer does not experience a discontinuity in current or voltage upon said switching of said switchable material.

20. The electrical device of claim 1, wherein said nonlinear resistive material is interconnected between said first electrode and said first active material layer and said second active material layer is interconnected between said first active material layer and said second electrode.

21. The electrical device of claim 1, wherein said first active material layer is interconnected between said nonlinear resistive material and said second active material layer.

22. The electrical device of claim 1, further comprising
a bottom interconnect, said first electrode being interconnected between said bottom interconnect and said first active material layer.

23. The electrical device of claim 1, further comprising:
a first insulator disposed on said nonlinear resistive material, said first insulator having a pore therethrough, said first active material layer occupying said pore and contacting said nonlinear resistive material.

24. The electrical device of claim 23, wherein said nonlinear resistive material contacts said first electrode.

25. The electrical device of claim 23, wherein said second active material layer contacts said first active material layer.

26. The electrical device of claim 1, wherein at least one of the first active material layer and the second active material layer is transformable between
an amorphous state,
a crystalline state, and
a partially crystalline state, wherein the first active material layer is transformable between the amorphous state, the crystalline state and the partially crystalline state whereas the second active material layer includes a predominantly amorphous material that exhibits little tendency to be transformable from the amorphous state to either of the crystalline state or the partially crystalline state.

27. An electrical device comprising:
a first electrode;
a second electrode;
a first active material layer disposed between said first electrode and said second electrode;
a second active material layer disposed between said first electrode and said second electrode, wherein a lower surface of the second active material layer is disposed adjacent an upper surface of the first active material layer wherein said second active material layer differs in composition from said first active material; and
a nonlinear resistive material consisting essentially of carbon and nitrogen that is disposed between said first electrode and said second electrode and in direct contact with the first active material layer, said nonlinear resistive material being electrically in series with said first electrode, said first active material layer, said second active material layer, and said second electrode.

28. The electrical device of claim 27, wherein at least one of the first active material layer and the second active material layer is transformable between
an amorphous state,
a crystalline state, and
a partially crystalline state, wherein the first active material layer is transformable between the amorphous state, the crystalline state and the partially crystalline state whereas the second active material layer includes a predominantly amorphous material that exhibits little tendency to be transformable from the amorphous state to either of the crystalline state or the partially crystalline state.

29. An electrical device comprising:
a first electrode;
a second electrode;
a first layer of material that includes an active material disposed between said first electrode and said second electrode;
a second layer of material including an amorphous active material disposed between said first electrode and said second electrode, wherein a lower surface of the second layer of material is disposed adjacent an upper surface of the first layer of material wherein said second active material layer differs in composition from said first active material; and
a nonlinear resistive material disposed between said first electrode and said second electrode and in direct contact with the first active material layer, said nonlinear resistive material being electrically in series with said first electrode, said first layer of material, said second layer of material, and said second electrode.

30. The electrical device of claim 29, wherein the first layer of material is transformable between an amorphous state, a crystalline state and a partially crystalline state whereas the second layer of material exhibits little tendency to be transformable from the amorphous state to either of the crystalline state or the partially crystalline state.

* * * * *